United States Patent
Otremba et al.

(10) Patent No.: US 7,800,217 B2
(45) Date of Patent: Sep. 21, 2010

(54) POWER SEMICONDUCTOR DEVICE CONNECTED IN DISTINCT LAYERS OF PLASTIC

(75) Inventors: Ralf Otremba, Kaufbeuren (DE); Helmut Strack, Munich (DE)

(73) Assignee: Infineon Technologies AG, Neubiberg (DE)

( * ) Notice: Subject to any disclaimer, the term of this patent is extended or adjusted under 35 U.S.C. 154(b) by 722 days.

(21) Appl. No.: 11/746,699

(22) Filed: May 10, 2007

(65) Prior Publication Data

US 2007/0284720 A1 Dec. 13, 2007

(30) Foreign Application Priority Data

May 10, 2006 (DE) ........................ 10 2006 021 959

(51) Int. Cl.
*H01L 23/12* (2006.01)
(52) U.S. Cl. ................. 257/700; 257/686; 257/688; 257/690; 257/693; 257/702; 257/724; 257/775
(58) Field of Classification Search ............... 257/686, 257/688, 690, 692, 693, 700, 702, 724, 775
See application file for complete search history.

(56) References Cited

U.S. PATENT DOCUMENTS

| 5,182,632 A * | 1/1993 | Bechtel et al. ............. 257/713 |
| 5,532,512 A | 7/1996 | Fillion et al. |
| 6,031,279 A | 2/2000 | Lenz |
| 6,269,014 B1 | 7/2001 | Sander et al. |
| 6,747,300 B2 | 6/2004 | Nadd et al. |
| 6,841,852 B2 | 1/2005 | Luo et al. |
| 6,927,484 B2 | 8/2005 | Thomas et al. |
| 7,030,501 B2 | 4/2006 | Yoshiba et al. |
| 2002/0030283 A1 | 3/2002 | Itabashi et al. |
| 2005/0161785 A1 | 7/2005 | Kawashima et al. |
| 2007/0246808 A1 | 10/2007 | Ewe et al. |

FOREIGN PATENT DOCUMENTS

| DE | 102004019443 B3 | 8/2005 |
| EP | 1225629 A2 | 7/2002 |
| WO | 03030247 A2 | 4/2003 |
| WO | 2005017994 A1 | 2/2005 |
| WO | 2005101504 A1 | 10/2005 |

* cited by examiner

*Primary Examiner*—Thanh V Pham
(74) *Attorney, Agent, or Firm*—Edell, Shapiro & Finnan, LLC

(57) ABSTRACT

A power semiconductor device and a method for its production. The power semiconductor device has at least one power semiconductor chip, which has on its top side and on its back side large-area electrodes. The electrodes are electrically in connection with external contacts by means of connecting elements, the power semiconductor chip and the connecting elements being embedded in a plastic package. This plastic package has a number of layers of plastic, which are pressed one on top of the other and have plane-parallel upper sides. The connecting elements are arranged on at least one of the plane-parallel upper sides, between the layers of plastic pressed one on top of the other, as a patterned metal layer and are electrically in connection with the external contacts by means of contact vias through at least one of the layers of plastic.

25 Claims, 8 Drawing Sheets

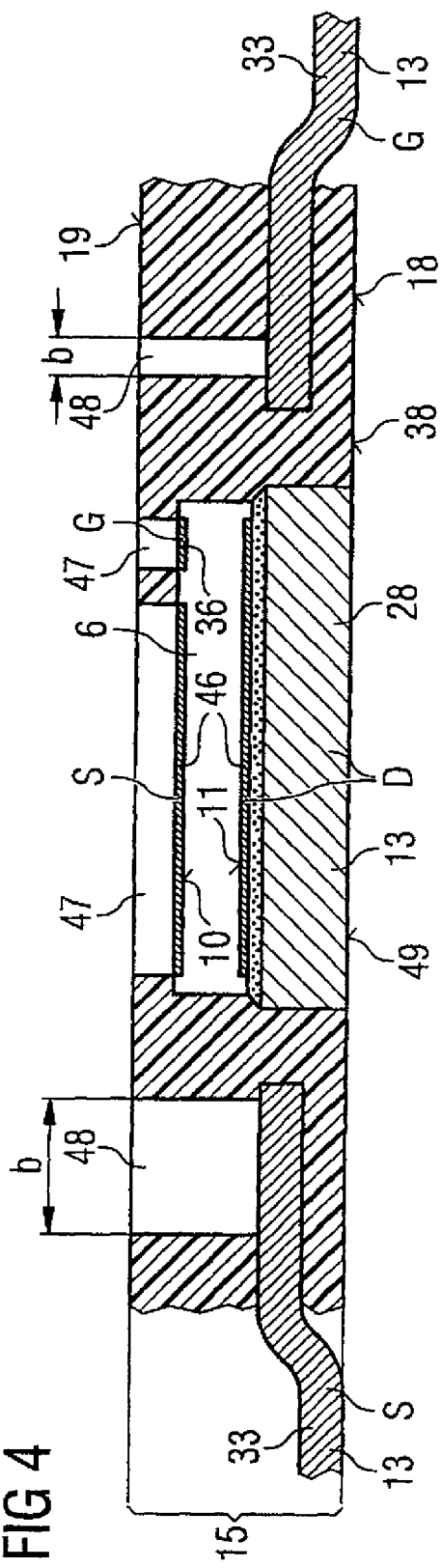
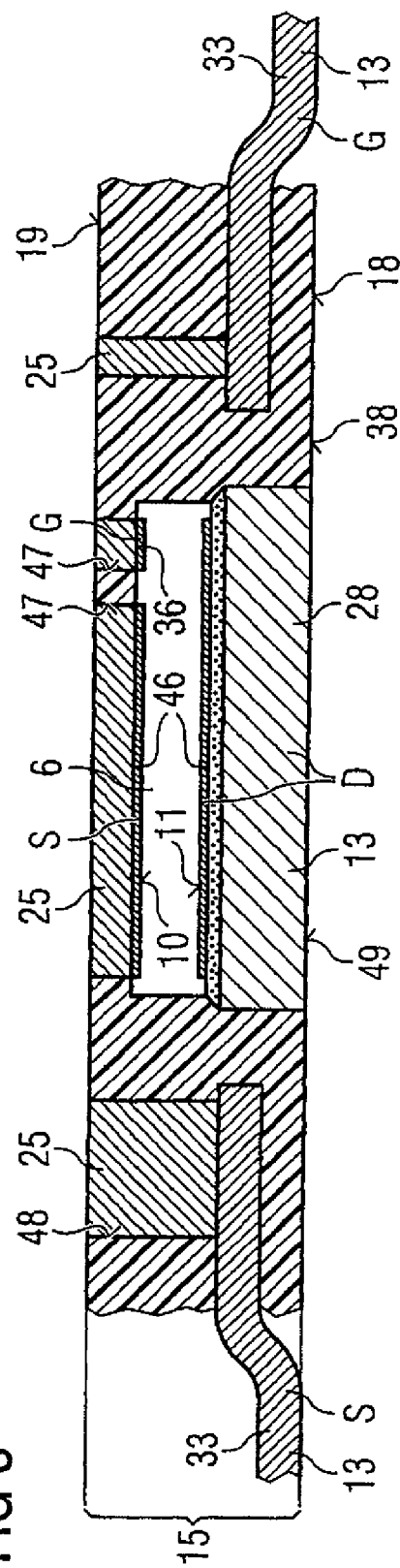
FIG 4
FIG 5

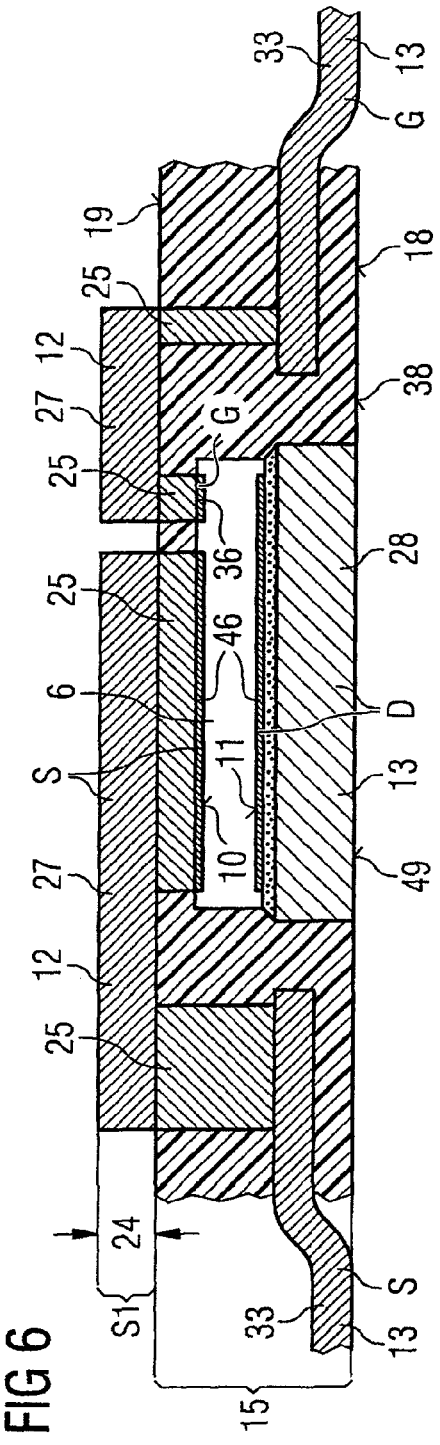
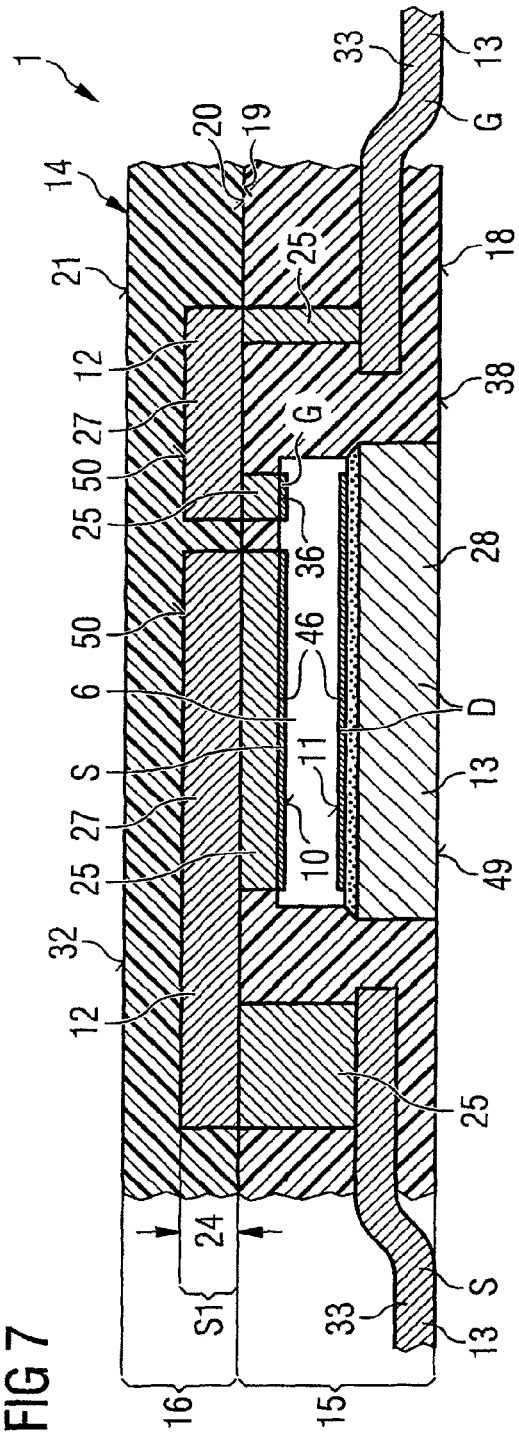

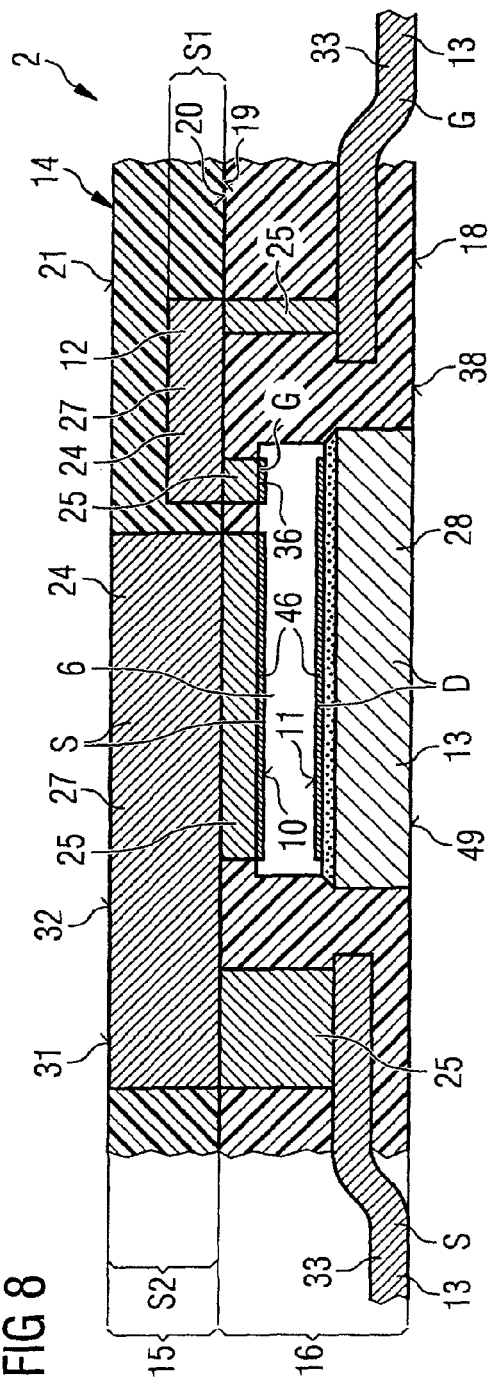
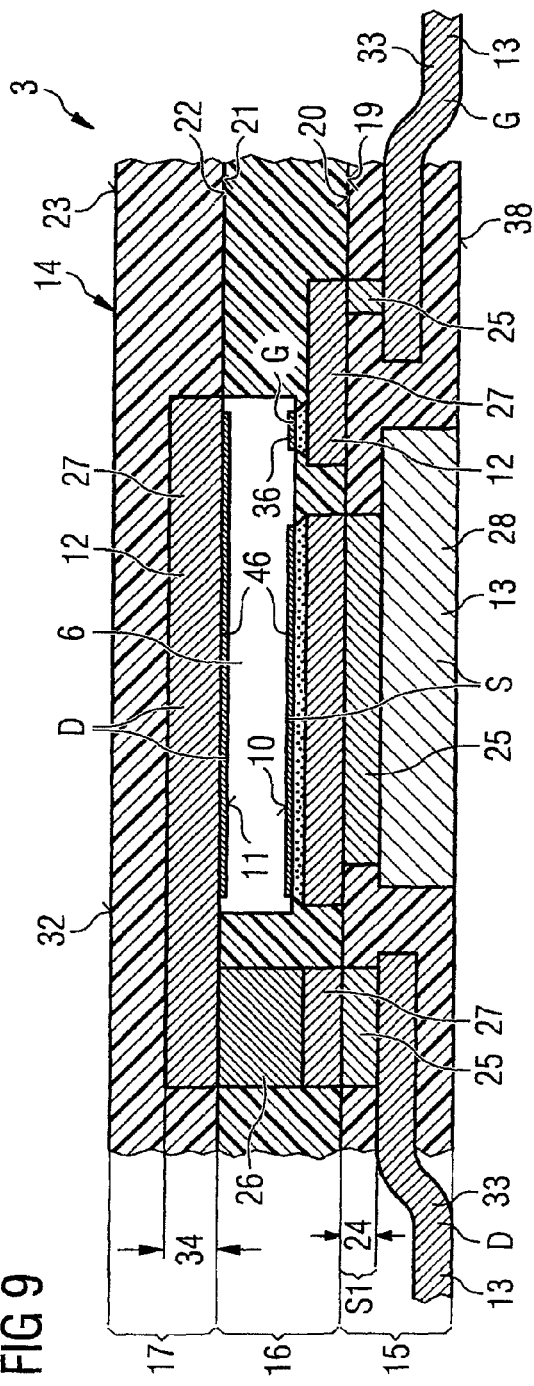
FIG 8
FIG 9

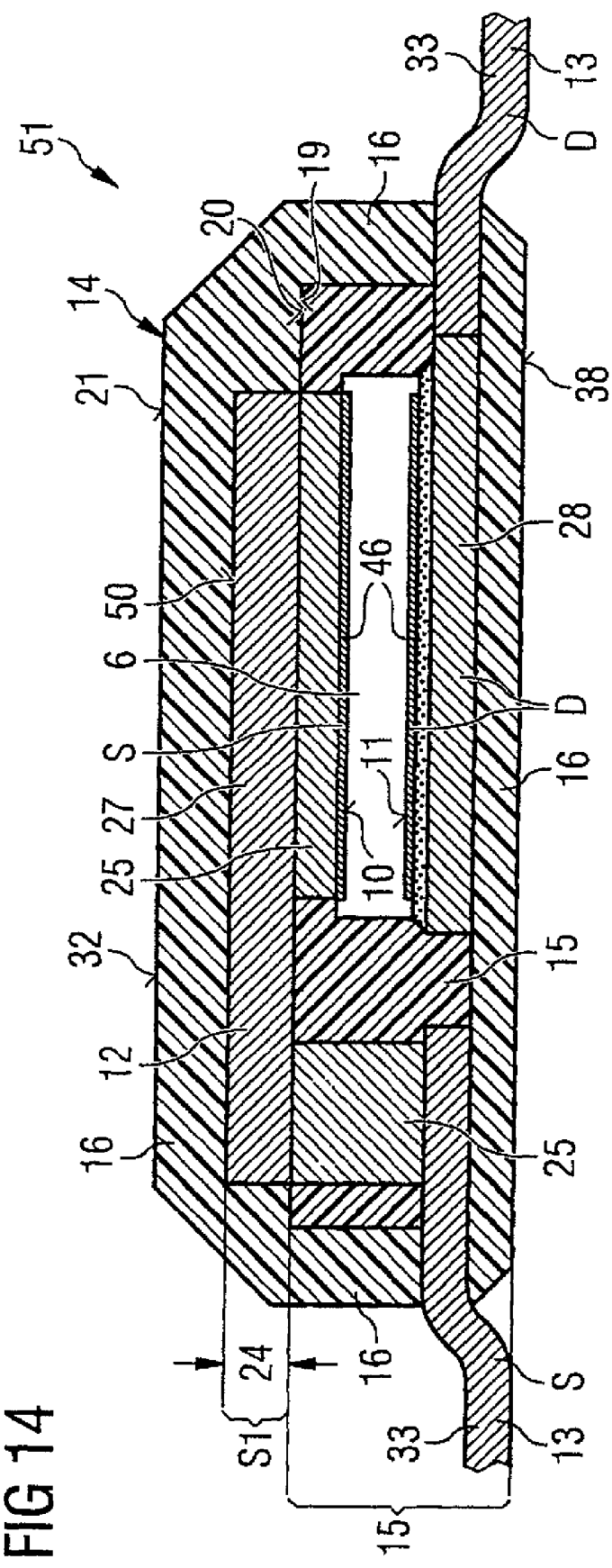

POWER SEMICONDUCTOR DEVICE CONNECTED IN DISTINCT LAYERS OF PLASTIC

FIELD OF THE INVENTION

Embodiments of the invention relate to a power semiconductor device and to a method for its production. The power semiconductor device has at least one power semiconductor chip, which has on its top side and on its back side not only small-area control electrodes but also large-area power electrodes. The electrodes are electrically in connection with external contacts by means of connecting elements, and the power semiconductor chip and the connecting elements being embedded in a plastic package.

BACKGROUND

Conventional power semiconductor devices, which have one or more power semiconductor chips, have electrical connecting elements which electrically connect top side and back side of the power semiconductor chip to external contact areas of the device. The external contact areas may be provided by a leadframe or on a wiring substrate. The electrical connecting elements may be provided by bonding wires, which extend between the top side of the power semiconductor chip and the external leads of the leadframe or through an electrically conducting clip from large-area electrodes of the top side of the semiconductor chip to the external contacts or the external leads, while a large-area backside electrode of the power semiconductor chip is fixed on a chip carrier of the leadframe.

Bonding wire connecting elements, as are used for a full-bridge circuit with power semiconductor components, are known from the document DE 196 35 582 C1. These have the disadvantage that they require a certain bonding loop height, with the result that the device package cannot be reduced in size any further. In order to overcome this problem, a planar wiring structure, which has at least two insulating films with conductor tracks, is to be provided, as known from document DE 10 2004 019 443 B3. One of the insulating films is laminated on the power semiconductor chip and has windows in which the conductor tracks of the other insulating film are to be arranged, in order to connect the contact areas of the power semiconductor chips electrically to a wiring substrate. However, this wiring solution has the disadvantage that the method of production is complicated, especially since a large number of components have to be produced, the components having to be adjusted to one another, laminated and mechanically and/or electrically connected to one another during production.

SUMMARY OF THE INVENTION

Embodiments of the invention provide a power semiconductor device that avoids the aforementioned problems of bonding wires and can be produced at low cost, without using costly films.

More specifically, embodiments of the invention provides a power semiconductor device with at least one power semiconductor chip, which has on its top side and on its back side not only small-area control electrodes but also large-area power electrodes. These large-area electrodes extend over virtually the entire power semiconductor chip and are electrically connected to external contacts by means of connecting elements. The power semiconductor chip and the connecting elements are embedded in a plastic package. This plastic package has a number of layers of plastic, which are pressed one on top of the other and have plane-parallel upper sides. The connecting elements are arranged on at least one of the plane-parallel upper sides, between the layers of plastic pressed one on top of the other, as a patterned metal layer or as a wiring layer, the connecting elements having contact vias which pass through at least one of the layers of plastic and by means of which a contact area of the power semiconductor chip is electrically in connection with external contacts.

Such a power semiconductor device has the advantage that neither bonding wires nor bonding tapes nor auxiliary films with corresponding conductor tracks have to be provided to realize a connection between external contacts and contact areas of the semiconductor chips. Rather, the plane-parallel upper sides of the layers of plastic of the plastic package are used to create with the aid of the patterned metal layer connecting elements in a wiring layer on these upper sides, which elements realize an electrical connection both with the contact areas of the embedded semiconductor chip and with corresponding external contacts by means of contact vias, which can likewise be incorporated in one of the layers of plastic.

With such connecting elements it is possible in an advantageous way to approach the current loading limit of the power semiconductor chips, since no current-limiting bonding wires or current-limiting conductor track films are used.

Rather, metal layer thicknesses that can be produced as desired, variably in their thicknesses according to the maximum current loading, can be realized on the plane-parallel upper sides between the layers of plastic.

Furthermore, the power semiconductor device has the advantage of increased reliability, since it is virtually impossible for the connecting elements to be torn off, since a layered construction is realized for the first time, both for the connecting elements and for the layers of plastic. With the layered construction, the thermal stresses, such as occur with bonded connections or film materials in comparison with silicon semiconductor chips, are virtually eliminated, since here the metallic wiring layers are made more compliant and elastic by the layered construction and closely hug the layers of plastic of the package and the large-area contact areas of the semiconductor chip.

The patterned metal layers are preferably applied by means of a PVD process (physical vapor deposition), with the result that the patterned metal layer consists of metal deposited in a finely crystalline form, which increases both the ductility and the elasticity of the connecting elements.

In a further preferred embodiment of the invention, the patterned metal layer comprises a metal deposited by means of a galvanic or chemical depositing process. Metal layers produced in this way, preferably of copper, can also achieve any desired thickness, in order to ensure the current carrying capacity. Furthermore, it is provided that the patterned metal layer has different layer thicknesses for different connecting elements. For instance, a greater or thicker metal layer is desirable whenever large-area electrodes are concerned, such as for example for the source terminal, while a much smaller thickness is required for signal transmission to a control electrode, such as for example a gate electrode. These different thicknesses can be realized in a simple and low-cost way by separate application, or by briefly interrupting the depositing process while at the same time covering the region for signal transmissions.

Furthermore, it is provided that the patterned metal layer has a number of connecting elements that are electrically insulated from one another, the connecting elements having at least one plate region, which goes over into one or more contact vias. This has the advantage that the plate region can be dimensioned in such a way that further power semiconductor chips or other semiconductor chips can in turn be fixed or stacked on it, so as to produce power semiconductor modules which have a number of power semiconductor chips embedded in a plastic package, without it being necessary to realize conductor track films and/or bonding wire connections or bonding tapes for the connection of contact areas of the power semiconductor chips to one another and/or for the connection of the contact areas of the power semiconductor chips to the external contacts.

A further advantage that ensures the reliability of these power semiconductor devices is that the plastic package molding compound is merely realized in a layered form, the conventional technique being abandoned in favor of first producing the layer of plastic and then incorporating the connecting elements. This is a great advance over the conventional technology, in which all the connections first have to be produced before a plastic package molding compound embeds these connecting elements, including the power semiconductor chips and any external contacts, in a plastic package molding compound.

In a further preferred embodiment of the invention, the power semiconductor device has a further semiconductor chip or a further passive component, which is arranged with its electrodes on the plate regions of the connecting elements. Consequently, the layered construction of the plastic package opens up new perspectives in the design of power semiconductor components, especially since plate regions and conductor track regions of the wiring layer can be designed as desired to meet the requirements of high-voltage power cascodes and/or bridge power circuits.

Such a plate region in a power semiconductor device according to the invention is provided as a chip carrier and can be adapted in the extent of its surface area in an advantageous way to the extent of the large-area contact areas of a power semiconductor chip. It is also possible to provide combinations of connecting elements according to the invention with plate regions and contact vias as well as simple bonded connections, if the pricing of the power semiconductor device allows.

Furthermore, it is possible by different thicknesses of the plate regions of the connecting elements to keep large-area plate regions of the patterned metal layer free of plastic, with the result that they can represent external contact areas on the upper side of the power semiconductor device. Such external contact areas on the upper side of a power semiconductor device make it possible to stack a number of power semiconductor devices one on top of the other in the form of a device stack and/or to use the exposed metal areas as additional possible means of cooling. For this purpose, this region that is free of plastic forms a partial region of the upper side of a power semiconductor device.

Plastic molding compounds, epoxy resins and or silicones may be used as suitable layers of plastic which, when brought one on top of the other, produce the plastic package, with the result that the plastic package finally comprises such materials in a layered form. Finally, it is provided that leads of a leadframe are freely accessible as external contacts from a lower layer of plastic. In this case, the leadframe is preferably a leadframe of a SuperSO or TO220 or TO252 type of package.

In a further preferred embodiment of the invention, the power semiconductor chip is arranged with its large-area back-side electrode in a lower layer of plastic on a chip carrier, while on its top side there is not only a large-area counter electrode but also a smaller contact area of a control electrode. The counter electrode is in this case electrically in connection with a plate region of a connecting element of the patterned metal layer by means of a large-area contact via. The control electrode, which has a smaller contact area on the top side of the power semiconductor chip, is correspondingly electrically connected to the patterned metal layer by means of a smaller contact via and a smaller planar region of a connecting element.

In this case, the chip carrier goes over directly into an external lead, which is often arranged centrally on the underside of the power semiconductor device. However, the connecting elements of the counter electrode on the top side and of the control electrode on the top side of the power semiconductor chip are electrically in connection with external leads of the lower layer of plastic by means of contact vias. Such an embodiment of the invention has the advantage of a compact, reliable construction, which substantially comprises layers of plastic pressed one on top of the other as a plastic package. In order to ensure the position of the power semiconductor chip on the chip carrier, the power semiconductor chip is integrally connected to the chip carrier by means of a diffusion solder, a soft solder or an electrically conducting adhesive.

Furthermore, it is provided that the plate region of a connecting element to a control electrode has a smaller thickness than the plate region of a connecting element to a counter electrode on the top side of the power semiconductor chip. The advantages of such a differing thickness of the wiring layer or the patterned metal layer have already been discussed above, these variable thicknesses on the one hand allowing for the greater power consumption of the counter electrode and on the other hand offering the possibility of creating access to the counter electrode on the top side of the power semiconductor device. In this case, the plate region of smaller thickness for the control electrode is covered by a second layer of plastic, while the thicker plate region is kept free of the plastic of the second layer of plastic.

In principle, a combination of the novel connecting elements and conventional bonding wires is also possible, if this appears to be appropriate. In such a case, the power semiconductor device has, in addition to connecting elements with a plate region and contact vias, a bonding wire to the contact area of the control electrode. This may be of advantage whenever the power semiconductor device has, as a multi-chip module (MCM), a semiconductor chip stacked on the patterned metal layer.

In a further preferred embodiment of the invention, the power semiconductor device has a semiconductor chip, which is stacked on the patterned metal layer and is embedded by a second layer of plastic, the second layer of plastic having on its planar or plane-parallel upper side a second patterned metal layer, the connecting elements of which are embedded in a third layer of plastic. In this case, the stacked semiconductor chip is not electrically connected with the aid of bonding wires and bonding tapes, but instead the technology of the novel connecting elements that has been used in the first and second layers of plastic is then also realized in a third layer of plastic. In this case, the triple molding of a power semiconductor device can be handled more dependably in technological terms than the complex practice known in the prior art of adjusting conductor track films or providing bonding wires in a serial arrangement.

In principle, this technique can be further developed as desired in a vertical direction, with the result that a preferred power semiconductor device has n power semiconductor chips stacked one on top of the other and/or n passive components stacked one on top of the other, which are embedded in n layers of plastic and are electrically in connection with external contacts on the underside of the power semiconductor device by means of n patterned metal layers between n+1 layers of plastic and associated contact vias. These n power semiconductor chips may comprise vertical MOSFETs or IGBTs. It is also possible with this technique to construct power cascodes from silicon carbide diodes or to assemble corresponding cascodes from different power semiconductor chips.

In a further embodiment of the invention, the power semiconductor device has a bridge circuit, two high-side switches being arranged in a first layer of plastic with a first patterned metal layer on its plane-parallel upper side and two low-side switches being arranged on the plate regions of the first patterned metal layer and arranged in a second layer of plastic with a second patterned metal layer on its plane-parallel upper side. In this case, the second patterned metal layer is embedded in a third layer of plastic, and the connecting elements of the patterned metal layers are electrically connected to external contacts of the power semiconductor device and/or to the contact areas of the power semiconductor chip by means of contact vias. Such a full-bridge circuit has the advantage that it is likewise compactly constructed, has no bonding wires and dispenses completely with sensitive film structures.

In the case of the preceding embodiments for stacking semiconductor chips, it is characteristic that a first semiconductor power transistor is electrically connected to an external lead by means of a first connecting element, the first connecting element having a first contact via and a second contact via and a plate region arranged in between. The second stacked semiconductor power transistor is then mounted on the plate region of the connecting element. In this case, the first contact via may be connected to an external lead and the second contact via may be connected to a contact area of the semiconductor chip arranged under the stacked power semiconductor chip.

To be specific, in the case of the bridge circuit, the drain electrodes of the two high-side switches are mounted on the chip carrier and are electrically connected to each other by means of the chip carrier. Furthermore, it is also possible to integrate the two high-side switches in a single semiconductor body or to mount the two high-side switches in separate power semiconductor chips on one chip carrier, as already described above.

In a further preferred circuit, the power semiconductor device has as the semiconductor chip a stack with a VJFET transistor and a MOSFET transistor.

A method for producing a power semiconductor device has the following method steps. Firstly, a leadframe is provided, having a chip carrier and a number of external leads. Furthermore, at least one power semiconductor chip is produced, with a top side and a back side, at least one large-area contact area of a counter electrode and a smaller contact area of a control electrode being arranged on the top side, and a large-area contact area of a power electrode being present on the back side of the power semiconductor chip. The power semiconductor chip is then mounted on the chip carrier, while establishing an electrical connection between the power semiconductor chip and the chip carrier.

After that, this arrangement is embedded in a first layer of plastic, while providing plane-parallel upper sides of the layer of plastic, to be specific a planar underside and a planar upper side. After that, the layer of plastic is patterned, which is carried out by laser ablation and/or by photolithographic processes, through-openings to the external leads and to contact areas of the power semiconductor chip being produced. After that, a metal is applied to the first patterned layer of plastic of the plastic package and the through-openings are filled with the metal by depositing metal. At the same time, a closed metal layer is produced on the entire plane-parallel upper side of the first layer of plastic. This metal layer is not completely planar, on account of the through-openings, and may be leveled by correspondingly known technologies, with the result that a patterning of the metal layer can subsequently be carried out. In this patterning of the metal layer, connecting elements are created, having on the one hand large-area plate regions and on the other hand contact vias to the contact areas of the top side of the power semiconductor chip and to external contacts in the first layer of plastic.

After producing the patterned metal layer on the plane-parallel upper side of the layer of plastic, a second layer of plastic may then be applied, in order to complete the plastic package, the possibility existing, at least to some extent, that thicker plate regions of the connecting elements protrude from the second layer of plastic and/or form a coplanar surface area with the upper side of the second layer of plastic, which may at the same time be an upper side of a power device.

This method has the advantage that not only can an individual power semiconductor device be produced in this way, but, with suitable selection of the leadframes, a multiplicity of power semiconductor devices can be produced simultaneously. In addition, the method has the advantage that everything is constructed in layers and no serial technologies such as bonding interrupt the production sequence. Finally, the method has the advantage that the power semiconductor components produced with it are extremely reliable, especially since it completely dispenses with bonding wires and difficult-to-adjust conductor track films.

In a preferred example of how the method is carried out, the power semiconductor chip is mounted on the chip carrier and, after that, embedded in the first layer of plastic of the plastic package before any connecting elements are created. This is in sharp contrast with the prior art, in which the connecting elements are first connected to the leadframe and the contact areas of the power semiconductor chip and then the entire construction is embedded in a plastic package molding compound. The two-stage nature of the package production method makes it possible first to produce the layer of plastic of the package and then to introduce the contact vias into the layer of plastic of the package and realize the associated plate regions of the connecting elements on the layer of plastic of the package.

As already mentioned above, the first layer of plastic is preferably provided as a closed layer, initially with a planar upper side, and then the latter is patterned, in order to produce through-openings to embedded contact areas of the power semiconductor chip and/or to corresponding surfaces of leads.

There are various methods for producing the patterned metal layer, to realize connecting elements on the upper side and connection to the through-openings of the first layer of plastic of the plastic package, one of these methods being that not only are the through-openings filled but a considerable proportion of metals is deposited beyond the through-openings, so that in a further patterning step the metal layer arranged on the plane-parallel upper side is further patterned. This creates a first wiring layer as a patterned metal layer on the first layer of plastic, the first wiring layer having one or more connecting elements, which respectively have at least one contact via and a plate region, the plate region being arranged on the planar upper side of the first layer of plastic. Furthermore, the first wiring layer is then embedded in a second layer of plastic of the plastic package.

This ensures that the second wiring layer remains protected from mechanical and chemical attacks and damage. However, even before the second layer of plastic of the package is introduced, further semiconductor chips and/or passive components may be mounted with their electrodes on the plate regions of the connecting elements by means of diffusion solder, soft solder or electrically conducting adhesive. This has the advantage that it is then possible in turn for a further layer of plastic of the package to be applied and then patterned and for contact vias then to be introduced into it and plate regions to be created on its plane-parallel upper side, which regions can in turn be made available for their part for further stackable semiconductor chips. However, this requires that two further layers of plastic must be applied, namely, one which embeds the stacked further semiconductor chip and a further one which covers the connecting elements for the connecting of the stacked semiconductor chip to the structures lying thereunder by means of corresponding contact vias through the embedding layer of plastic for its part. The application of the layers of plastic may be carried out by means of injection-molding processes. Furthermore, it is possible with this method to realize inexpensive and reliable bridge circuits and half-bridge circuits as well as cascode circuits.

To sum up, it can be stated that, with this advantageous method, the plastic molding compound can be used as an insulation for the chip surface and or as an insulation for the chip carrier and the process costs can be reduced by the costs for films or ceramic material. In addition, the molding process is used in an advantageous way for insulating subsequent planar wiring layers, it being possible in turn for these wiring layers to be used in an advantageous way for producing multi-chip modules (MCM).

BRIEF DESCRIPTION OF THE DRAWINGS

The invention is explained in more detail below on the basis of the accompanying figures.

FIG. 4 shows a schematic cross section through the first layer of plastic according to FIG. 3 after patterning the layer of plastic;

FIG. 5 shows a schematic cross section through the first layer of plastic according to FIG. 4 after filling through-openings;

FIG. 6 shows a schematic cross section through the first layer of plastic according to FIG. 5 after applying a wiring layer to the plane-parallel upper side of the first layer of plastic;

FIG. 7 shows a schematic cross section through the first layer of plastic according to FIG. 6 after applying a second layer of plastic, while embedding the wiring layer;

FIG. 8 shows a schematic cross section through a power semiconductor device according to a second embodiment of the invention;

FIG. 9 shows a schematic cross section through a power semiconductor device according to a third embodiment of the invention;

FIG. 14 shows a schematic cross section through a power semiconductor device of a sixth embodiment of the invention.

DETAILED DESCRIPTION

FIGS. 1 to 7 show schematic cross sections through components in the production of a power semiconductor device 1 according to a first embodiment of the invention. Components with the same functions are identified in the subsequent figures by the same designations and are not explained more than once.

Figure 1:
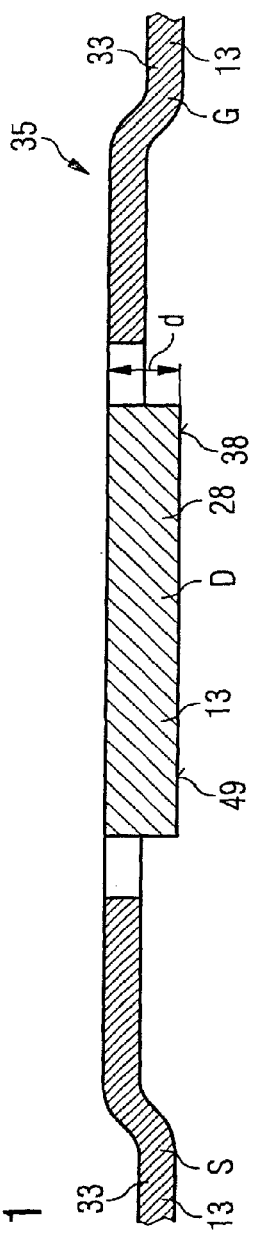
FIG. 1 shows a schematic cross section through a leadframe.

FIG. 1 shows a schematic cross section through a leadframe 35. Such leadframes 35 may, depending on the type of package, be differently patterned. There are leadframes which have in addition to a chip carrier 28, as is shown in FIG. 1, external leads 33, which are dimensioned in such a way that they provide external contact areas on the underside and/or on edge sides of a plastic package 14 after completion. Other leadframes 35 are intended to allow leads 33 to protrude as external contacts 13 from the plastic package of the power semiconductor device on the edge sides. In this embodiment of the invention, a leadframe 35 is used, having external contacts 13 which have the form of external leads 33. In this first embodiment of the invention, a number of external leads 33 of the left side are combined to form a source terminal S and, on the right side, one of the external leads 33 is used for a gate terminal G, while the chip carrier 28 is of such a thickness d that an external contact area 49 for a drain terminal D is arranged on the underside 38 of the package.

Figure 2:
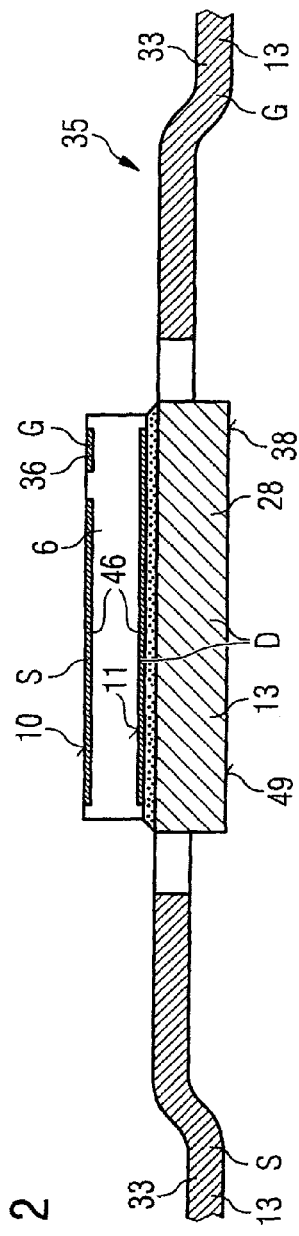
FIG. 2 shows a schematic cross section through the leadframe according to FIG. 1 after loading with a power semiconductor chip.

FIG. 2 shows a schematic cross section through the leadframe 35 according to FIG. 1 after loading with a power semiconductor chip 6. This power semiconductor chip 6 has on its back side 11 a large-area contact area 46, which represents the drain electrode D, and is integrally connected by the back side 11 to the chip carrier 28. Arranged on the top side 10 of the power semiconductor chip 6 there is likewise a large-area contact area 46, which represents the source electrode S, and, alongside it, a small-area contact area 36, which is available for the control electrode or gate electrode G. While the chip carrier 28 provides the drain electrode D with an external contact area 49, allowing it to revert to the large-area drain electrode D of the back side 11 of the semiconductor chip 6, there are no connections to the external leads 33 for the source electrode S and the gate electrode G, and nevertheless this arrangement is then already embedded in a first layer of plastic.

Figure 3:
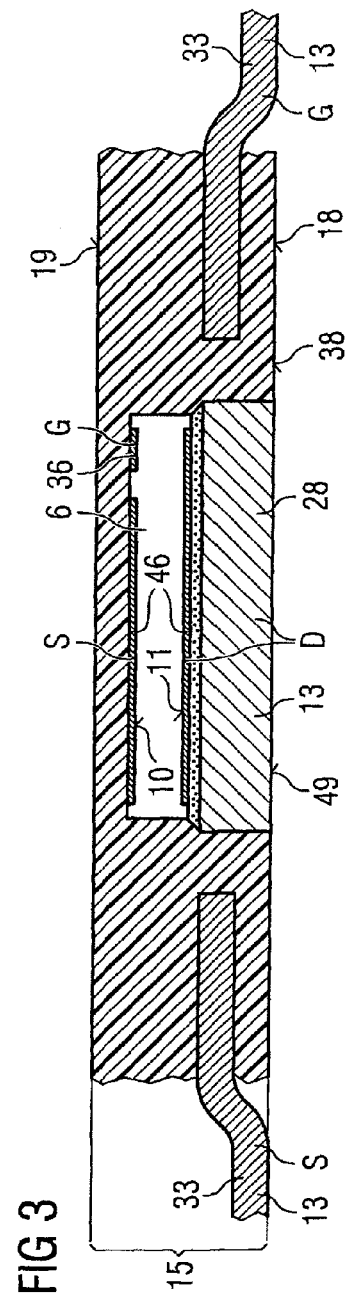
FIG. 3 shows a schematic cross section through the leadframe according to FIG. 2 after embedding the power semiconductor chip and the leadframe in a first layer of plastic.

FIG. 3 shows a schematic cross section through the leadframe 35 according to FIG. 2 after embedding the power semiconductor chip 6 and the leadframe 35 in a first layer of plastic 15, without connecting elements being present between the contact areas 46 and 36 on the top side 10 of the power semiconductor chip 6 with the external leads 33. In this state of production, the power semiconductor device would not be in a form in which it can function or be tested. However, this intermediate step has the advantage that there are no bonding wires which could be displaced or damaged when the first layer of plastic is introduced. Furthermore, the risk of the formation of voids is likewise avoided, since no cavities or intermediate spaces have to be filled in the case of this first layer of plastic of the package. Only with the next step is access possible to the contact areas 36 and 46 on the top side 10 of the semiconductor chip 6 and at the same time is access also possible to the leads 33, to the extent to which they are anchored within the layer of plastic 15. Furthermore, FIG. 3 shows a further advantage of this early formation of a layer of plastic 15. It is possible to form a completely planar or plane-parallel upper side 19, which is arranged plane-parallel to the underside 18 of the layer of plastic 15 and can be used to form on it a wiring layer comprising a patterned metal layer with corresponding connecting elements.

FIG. 4 shows a schematic cross section through the first layer of plastic 15 according to FIG. 3 after patterning the layer of plastic 15, by through-openings 48 to the leads 33 being created from the plane-parallel upper side 19, the width b of which openings is based on the currents that are to be switched or controlled. Furthermore, through-openings 47 to the contact areas 46 and 36 are created on the top side 10 of the power semiconductor chip 6, the extent of the surface area of which openings is based on the extent of the surface area of the corresponding contact areas 46 and/or 36.

FIG. 5 shows a schematic cross section through the first layer of plastic 15 according to FIG. 4 after filling the through-openings 47 and 48 with a conducting material to form contact vias 25. This produces different contact vias 25 with different depths and widths, depending on whether contact vias 25 to the leads 33 are to be created or contact vias 25 to the contact areas 46 or 36 situated on the top side 10 of the power semiconductor chip 6 are to be produced. When filling the through-openings 48 and 47, coatings of different thicknesses may be obtained on the plane-parallel upper side 19. These coatings of different thicknesses may, however, be leveled by removal of material, with the result that a plane-parallel upper side 19 comprising coplanar areas of the contact vias 25 and of the first layer of plastic 15 is in turn available for a wiring layer. To some extent, however, it is also possible for these elevated deposits on the upper side 19 already to be used to carry out subsequently a patterning of this metal layer that is produced on the upper side 19 when filling the through-openings 47 and 48, to form corresponding connecting elements, and to dispense with a planarizing step.

FIG. 6 shows a schematic cross section through the first layer of plastic 15 according to FIG. 5 after applying a wiring layer 24 to the plane-parallel upper side 19 of the first layer of plastic 15. For this purpose, a continuous metallic layer may be first deposited on the plane-parallel upper side 19 and this can subsequently be etched or removed to form a patterned metal layer 24. In any event, it is possible with this wiring layer 24 to complete connecting elements 12, which comprise a plate region 27 and in each case two contact vias 25, one contact via 25 being in connection with an external contact 13 and a further contact via 25 establishing the connection to the contact areas 36 and 46 on the top side 10 of the power semiconductor chip 16. Since the layer thickness S1 of the wiring layer 24 is merely dependent on the duration of a deposition of a metal layer on the plane-parallel upper side 19 of the first layer of plastic 15, the layer thickness S1 can consequently be adapted completely to the current loading for the power semiconductor component. Furthermore, it is possible also to produce different layer thicknesses for different connecting elements 12.

FIG. 7 shows a schematic cross section through the first layer of plastic 15 according to FIG. 6 after applying a second layer of plastic 16, while embedding the wiring layer 24. This second layer of plastic 16 covers with its underside 20 the plane-parallel upper side 19 of the first layer of plastic 15, to the extent to which it is not covered by the plate regions 27 of the connecting elements 12. Furthermore, the second layer of plastic 16 covers and protects the upper sides 50 of the plate regions 27 of the connecting elements 12, to the extent to which the layer thickness S1 of the plate regions 27 is less than the layer thickness D of the second layer of plastic 16 of the package 14 of the power semiconductor component 1.

With this embodiment, planar wiring layers of a power-MOSFET with a source electrode and a gate electrode on the top side of the chip and a drain electrode on the back side of the chip can be realized in a so-called Super SO package. For this purpose, the power semiconductor chip 6 is first connected in an electrically conductive and integral manner to the chip carrier 28, for example by means of diffusion soldering, soft soldering or adhesive bonding, and after that the power semiconductor chip 6 and the chip carrier 28 are surrounded with a first layer of plastic 15. Only then is this first layer of plastic 15 comprising a molding compound patterned, preferably by laser ablation or by an etching or profiling process. Furthermore, patterning may also be realized already during the embedding by a correspondingly formed tool.

To produce the wiring layer 24, a metallic seed layer may first be deposited on the then patterned first layer of plastic 15, in order that a galvanic or chemical deposition of the respective contact metal for the contact vias, such as aluminum, copper or nickel, can subsequently be performed in the respective prepared through-openings 47 and 48. The wiring layer 24 on the first layer of plastic 15 may also be used as a wire bonding area or as a further chip carrier area for multichip mounting (MCM).

In the production of the second layer of plastic 16, it is mounted with its underside 20 on the first layer of plastic 15. With the plate regions 27 of the connecting elements 12 being formed with different thicknesses, it is also possible that the electrodes of the power semiconductor chip 6 can be accessed from the surface 32 of the power semiconductor device, which is formed by the upper side 21 of the second layer of plastic 16. This is shown in the second embodiment of the invention.

FIG. 8 shows a schematic cross section through a power semiconductor device 2 according to a second embodiment of the invention. Components with the same functions as in the previous figures are identified by the same designations and are not explained in any more detail. The difference between the second embodiment of the invention according to FIG. 8 and the first embodiment of the invention according to FIG. 7 is that the plate regions 27 of the wiring elements 12 have different thicknesses S1 and S2. While the smaller thickness S1 is used for signal connecting elements, the greater thickness S2 is suitable for having access to the source electrode S of the power semiconductor device 2 in this embodiment of the invention from the upper side 32 of the power semiconductor device 2 in the plastic-free region 31 of the patterned metal layer 24.

FIG. 9 shows a schematic cross section through a power semiconductor device 3 according to a third embodiment of the invention. The difference from the previous embodiments of the invention is that the source electrode S of the power semiconductor chip 6 is connected to the chip carrier 28 in a first layer of plastic 15 by means of a plate region 27 of a connecting element 12 with contact vias 25. The power semiconductor chip 6 itself is arranged in a second layer of plastic 16 and is covered by a third layer of plastic 17.

Arranged in the third layer of plastic 17 is a further wiring layer 34, which has a further plate region 27 of a connecting element 12. The further plate region 27 of the connecting element 12 in the third layer of plastic 17 forms a connection between the drain electrode D on the back side 11 of the power semiconductor chip 6 and a lead 33 by means of a contact via 26 and a plate region 27 in the second layer of plastic 16 as well as by means of a further contact via 25. Consequently, the source electrode S is then connected to the external contact area 49 of the power semiconductor device 3 and the package 14 comprises three layers of plastic 15, 16 and 15 17, which are stacked one on top of the other and are connected to one another, the underside 22 of the third layer of plastic 17 being fixed on the upper side 21 of the second layer of plastic 16 and the upper side 23 of the third layer of plastic 17 forming the upper side 32 of the power semiconductor device.

Figure 10:
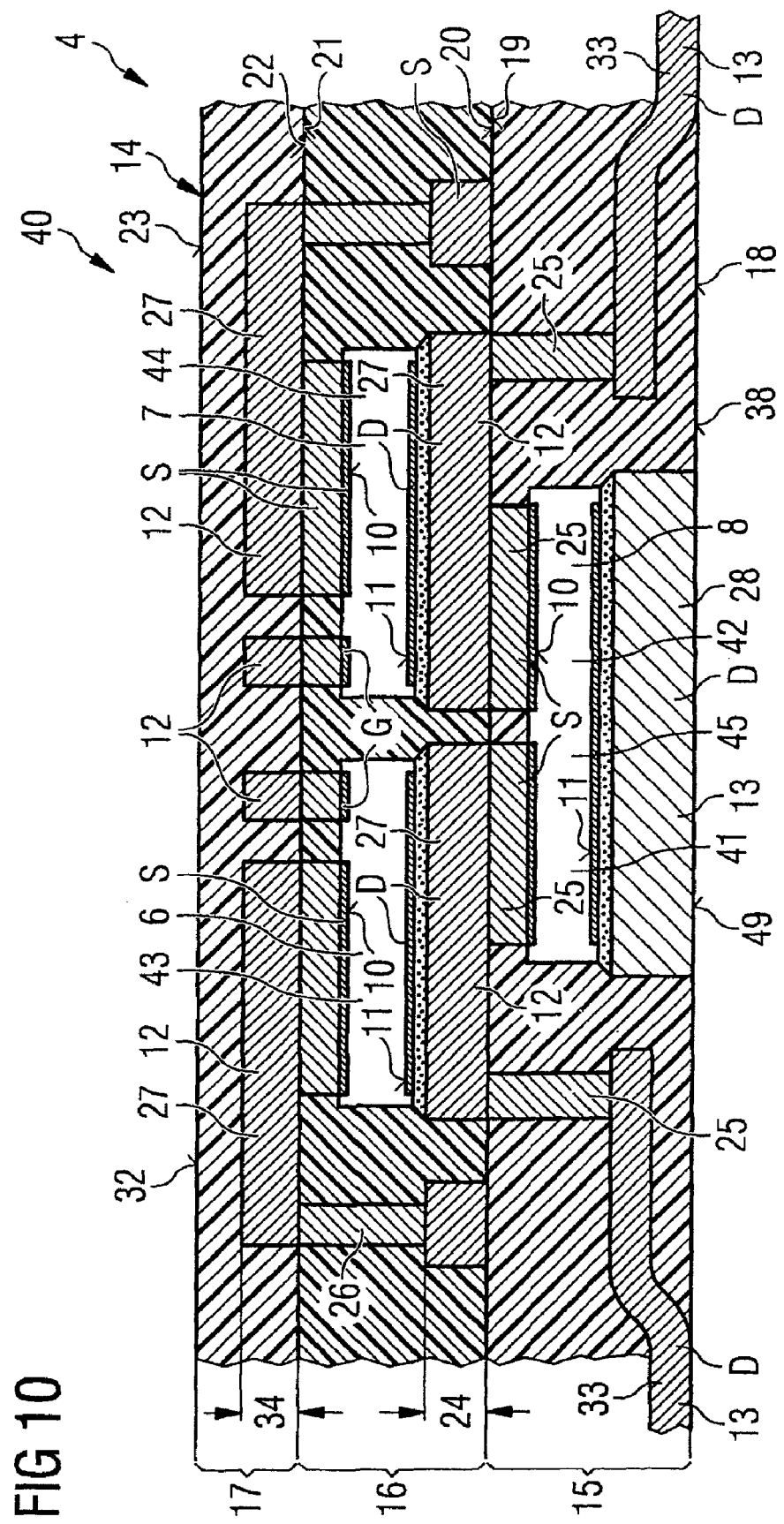
FIG. 10 shows a schematic cross section through a power semiconductor device according to a fourth embodiment of the invention.

FIG. 10 shows a schematic cross section through a power semiconductor device 4 according to a fourth embodiment of the invention. Three layers of plastic 15, 16 and 17 are also arranged one on top of the other in the case of this embodiment of the invention, this power semiconductor component representing a bridge circuit 40, in which an integral power semiconductor chip 8, which integrates two high-side switches 41 and 42 in a common semiconductor body 45, is arranged in the first layer of plastic 15. While the back side 11 of this integrated power semiconductor chip 8 has a common drain electrode D, two separate source electrodes S and two separate gate electrodes (not shown here) are arranged on the top side 10 of the integrated power semiconductor chip 8, the source electrodes being electrically connected to plate regions 27 of a wiring layer 24 on the plane-parallel upper side 19 of the first layer of plastic 15 by means of contact vias 25.

Two low-side switches 43 and 44 in the form of power semiconductor components 6 and 7 are arranged with their drain electrodes on the plate regions 27 of the first wiring layer 24; the source and gate electrodes S and G can be seen on the top sides 10 of the power semiconductor chips 6 and 7. These are in turn embedded in a second layer of plastic 16 and connected to contact vias 26, which belong to connecting elements 12, which interact with corresponding plate regions 27 of a second wiring layer 34 of a patterned metal layer in the third layer of plastic 17. With this embodiment of the invention it is shown that MCM power semiconductor devices are also possible in the complex embodiment of a full-bridge circuit. Such multi-chip modules (MCM) are realized here without an additional spacer, as is otherwise customary in the case of such power semiconductor devices; rather, one of the layers of plastic that are provided assumes the function of a spacer. This produces a CoC module (Chip on Chip), which can be repeated as desired, it being possible to use the injection-molding process as often as desired. In each case, the embedding in a layer of plastic is carried out before electrical connecting by means of connecting elements.

Figure 11:
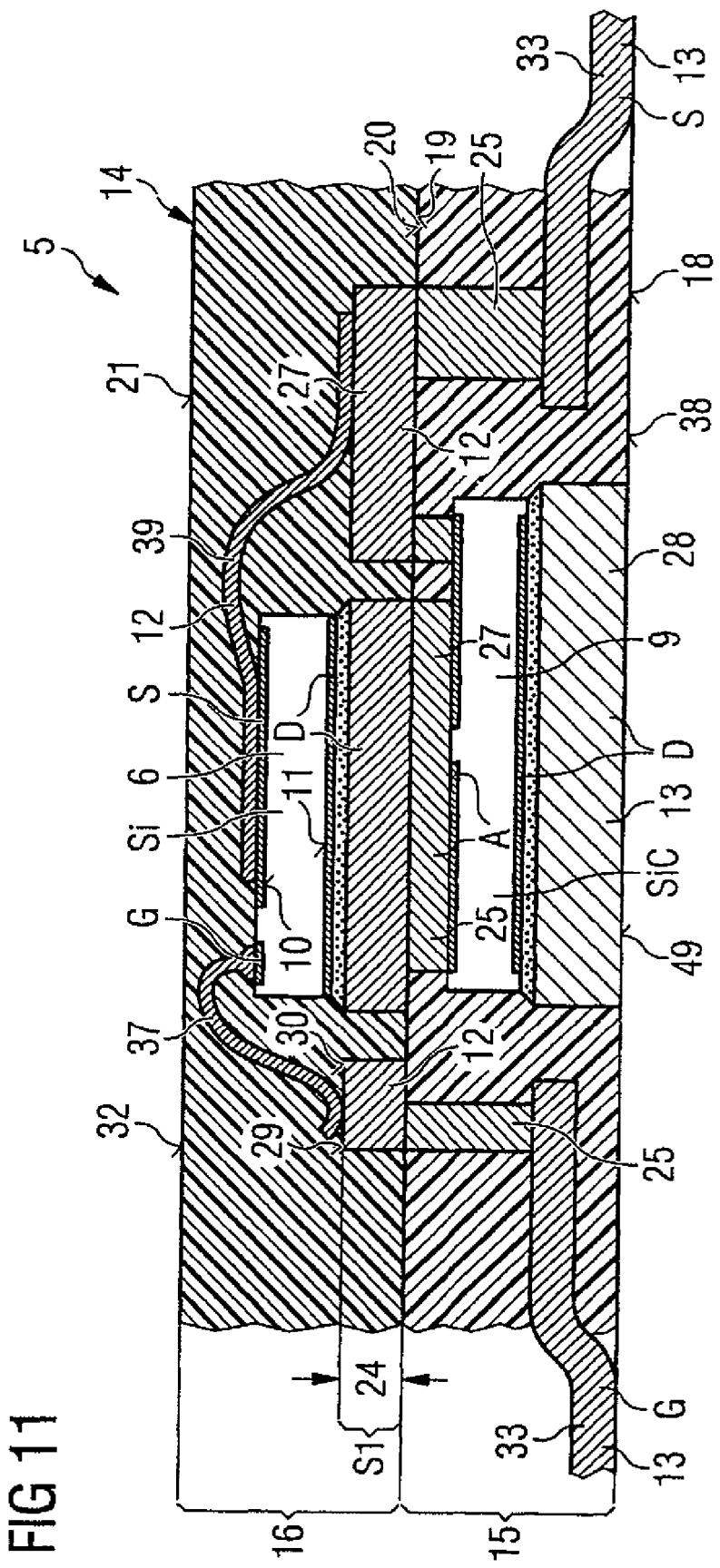
FIG. 11 shows a schematic cross section through a power semiconductor device according to a fifth embodiment of the invention.

FIG. 11 shows a schematic cross section through a power semiconductor device 5 according to a fifth embodiment of the invention. This embodiment of the invention dispenses with a third layer of plastic, providing instead a combination of the previously described technology and a conventional bonding wire or bonding tape technique for the stacking of semiconductor chips. This power semiconductor device 5 differs from the power semiconductor device 4 according to the fourth embodiment of the invention in that, although a power semiconductor chip 6 is also stacked on a semiconductor chip in the second layer of plastic 16, the base power semiconductor chip comprises a silicon-carbide-based JFET, the source of the JFET 9 being connected to the drain electrode D of the stacked power semiconductor chip 6. The drain of the JFET 9 is electrically and integrally connected to the chip carrier 28.

The first layer of plastic 15 accordingly has the JFET 9 and the second layer of plastic 16 has a stacked power semiconductor chip 6, the control electrode G of which is connected to a corresponding upper side region 29 of a bonding wire terminal area 30 of a plate region 27 of the wiring layer 24 by means of a bonding wire 37, the upper side region 29 being electrically in connection with a corresponding lead 33 by means of a contact via 25 in the first layer of plastic 15. The large-area source electrode S on the top side 10 of the power semiconductor chip 6 is electrically connected to a plate region 27 of a connecting element 12 by means of a bonding tape 39, this connecting element 12 at the same time connecting the source of the JFET 9 to an external lead 33 of the power semiconductor device 5.

Figure 12:
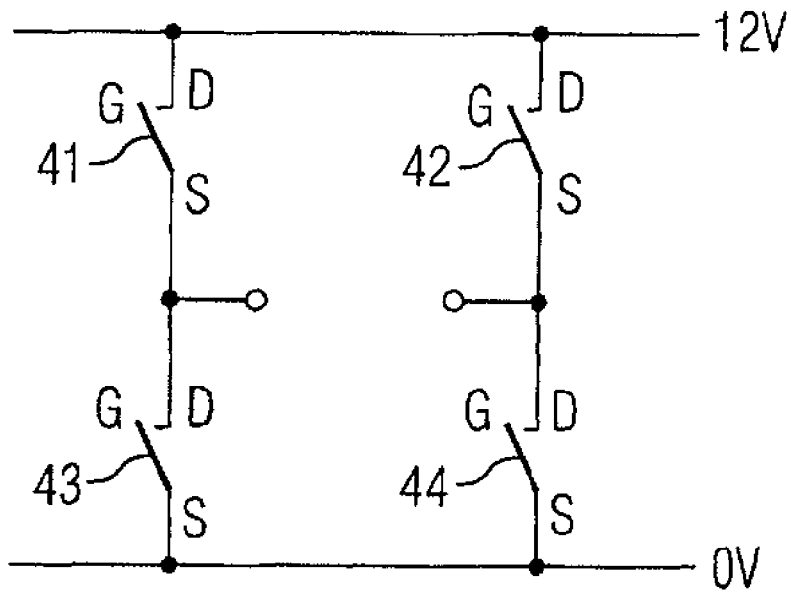
FIG. 12 shows a circuit diagram of a bridge circuit comprising two half-bridges.

FIG. 12 shows a circuit diagram of a bridge circuit comprising two half-bridges.

Figure 13:
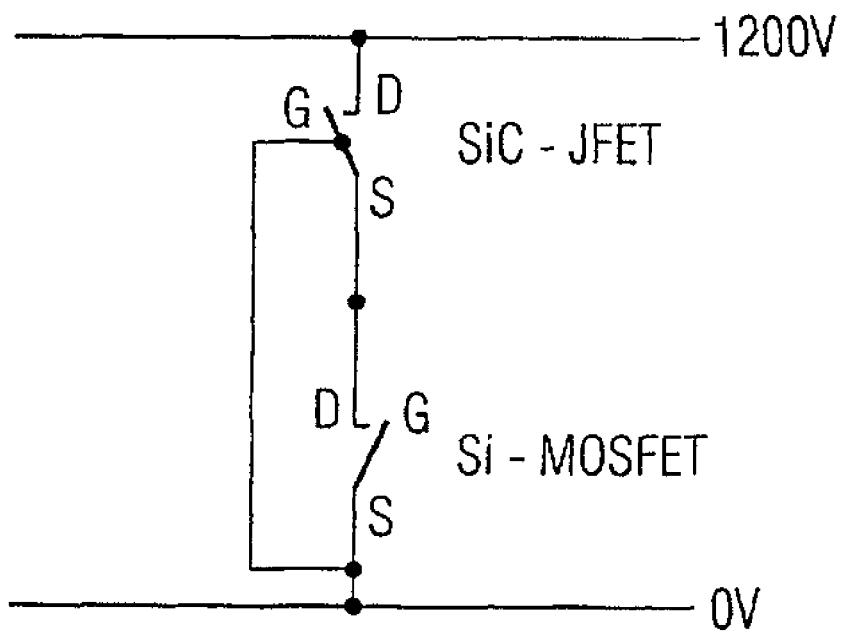
FIG. 13 shows a circuit diagram of a cascode arrangement comprising an SiC-JFET and a power-MOSFET.

FIG. 13 shows the circuit diagram of a cascode circuit arrangement comprising an SiC-JFET and a power-MOSFET.

FIG. 14 shows a schematic cross section through a power semiconductor device 51 of a sixth embodiment of the invention. This power semiconductor device 51 differs from the first five embodiments (1 to 5) in that a package 14 of the FPAK type (full package) is used here. This type of package has areas of plastic on all sides, even on the underside 38 of the package 14. In order to reach the electrodes S, D and G of the power semiconductor chip 6 from the outside, corresponding leads 33 protrude laterally from the plastic package 14. The layered construction of the plastic package is also realized in this plastic package 14. For this purpose, the plastic package 14 has a first layer of plastic 15, in which the leads 33 are anchored, and in which the power semiconductor chip 6 is embedded. The second layer of plastic 16 encapsulates the first layer of plastic 15 on all sides and forms the outer contour of the plastic package 14.

Patent claims:

1. A power semiconductor device, comprising:
    at least one power semiconductor chip having respective top side and back side large-area electrodes being electrically in connection with external contacts via connecting elements, said back side large-area electrode extending over substantially the entire power semiconductor chip,
    the power semiconductor chip and the connecting elements being embedded in a plastic package comprising a plurality of discrete layers of plastic, which are disposed one on top of the other and have plane-parallel upper sides,
    the connecting elements being arranged on at least one of the plane-parallel upper sides, between at least two of the plurality of discrete layers of plastic, in a wiring layer as a patterned metal layer, and being electrically in connection with the large-area electrodes and the external contacts by means of contact vias through at least one of the plurality of discrete layers of plastic.

2. The power semiconductor device of claim 1, wherein the patterned metal layer has different layer thicknesses.

3. The power semiconductor device of claim 1, wherein the connecting elements are electrically insulated from one another, and the connecting elements having at least one plate region, which extends over one of the contact vias.

4. The power semiconductor device of claim 3, wherein a further semiconductor chip and/or a passive component are arranged with respective electrodes on the plate regions of the connecting elements.

5. The power semiconductor device of claim 3, wherein the at least one plate region is provided as a chip carrier.

6. The power semiconductor device of claim 3, wherein an upper side region of the at least one plate region has at least one bonding wire terminal area.

7. The power semiconductor device of claim 1, wherein a region of the patterned metal layer is free of plastic.

8. The power semiconductor device of claim 7, wherein the plastic package is a full package and an upper side and an underside of the power semiconductor device are areas of plastic, and external leads, which are anchored in a lower layer of plastic of the plastic package, protrude from at least one edge side of the plastic package.

9. The power semiconductor device of claim 1, wherein the plurality layers of plastic is comprised of a plastic molding compound, an epoxy resin or a silicone.

10. The power semiconductor device of claim 1, wherein leads of a leadframe protrude as external contacts from a lower layer of plastic.

11. The power semiconductor device of claim 10, wherein the leadframe is configured to be consistent with a SuperSO or TO220 or TO252 type of package.

12. The power semiconductor device of claim 1, wherein the power semiconductor chip is arranged with its large-area back-side electrode in a lower layer of plastic on a chip carrier and has on its top side a large-area counter electrode and a smaller contact area for a control electrode, the counter electrode being electrically in connection with a plate region of one of the connecting elements of the patterned metal layer and the control electrode being electrically in connection with a smaller plate region of one of the connecting elements of the patterned metal layer, the connecting elements being electrically connected to external leads (33) in the lower layer of plastic by means of the contact vias.

13. The power semiconductor device of claim 12, wherein the power semiconductor chip is mounted on the chip carrier by means of a diffusion solder, a soft solder or an electrically conducting adhesive.

14. The power semiconductor device of claim 12, wherein a plate region associated with the control electrode has a smaller thickness than a plate region associated with the counter electrode.

15. The power semiconductor device of claim 14, wherein the plate region of smaller thickness is covered by a second layer of plastic and the plate region associated with the counter electrode is kept free of the second layer of plastic.

16. The power semiconductor device of claim 12, further comprising a bonding wire connected to the control electrode.

17. The power semiconductor device of claim 1, wherein the power semiconductor device has a semiconductor chip, which is stacked on the patterned metal layer and is embedded by one of the plurality of layers of plastic, the one of the plurality of layers of plastic having on a planar upper side a second patterned metal layer, connecting elements of which are embedded in another one of the plurality of layers of plastic.

18. The power semiconductor device of claim 1, wherein the power semiconductor device has n power semiconductor chips and/or n passive components stacked one on top of the other, which are embedded in n layers of plastic and are electrically in connection with the external contacts on an underside of the power semiconductor device by means of n patterned metal layers between n+1 layers of plastic and associated contact vias.

19. The power semiconductor device of claim 1, wherein the power semiconductor device comprises a vertical MOSFETs or IGBTs.

20. The power semiconductor device of claim 1, wherein the power semiconductor device has a bridge circuit, two high-side switches arranged in a first layer of plastic with a first patterned metal layer on a plane-parallel upper side and two low-side switches arranged on plate regions of the first patterned metal layer and arranged in a second layer of plastic with a second patterned metal layer on a plane-parallel upper side, and the second patterned metal layer being embedded in a third layer of plastic and connecting elements of the patterned metal layers being electrically in connection with external contacts of the power semiconductor device by means of the contact vias (25, 26).

21. The power semiconductor device of claim 20, wherein a first semiconductor power transistor is electrically connected to an external lead by means of a first connecting element, the first connecting element having a first contact via and a second contact via and a plate region arranged in between, and the second semiconductor power transistor being mounted on the plate region (27) of the connecting element (12).

22. The power semiconductor device of claim 20, wherein drain electrodes of the two high-side switches are mounted on a chip carrier and electrically connected to each other.

23. The power semiconductor device of claim 20, wherein the two high-side switches are provided in a semiconductor body or as separate power semiconductor chips.

24. The power semiconductor device of claim 1, wherein the power semiconductor device has a cascode circuit comprising stacked semiconductor chips.

25. The power semiconductor device of claim 1, wherein the power semiconductor device comprises a stack with a VJFET transistor and a MOSFET transistor.

* * * * *